(12) United States Patent
Davis et al.

(10) Patent No.: US 10,090,264 B2
(45) Date of Patent: *Oct. 2, 2018

(54) METHOD TO IMPROVE CMP SCRATCH RESISTANCE FOR NON PLANAR SURFACES

(71) Applicant: Texas Instruments Incorporated, Dallas, TX (US)

(72) Inventors: Jonathan Philip Davis, Allen, TX (US); Andrew Frank Burnett, Plano, TX (US); Brian Edward Zinn, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/434,406

(22) Filed: Feb. 16, 2017

(65) Prior Publication Data

US 2017/0162526 A1 Jun. 8, 2017

Related U.S. Application Data

(62) Division of application No. 14/818,275, filed on Aug. 4, 2015, now Pat. No. 9,604,338.

(51) Int. Cl.
*H01L 23/00* (2006.01)
*H01L 21/3105* (2006.01)
*H01L 21/311* (2006.01)

(52) U.S. Cl.
CPC ........ *H01L 24/03* (2013.01); *H01L 21/31053* (2013.01); *H01L 21/31116* (2013.01); *H01L 21/31133* (2013.01); *H01L 21/31138* (2013.01); *H01L 24/05* (2013.01); *H01L 2224/0382* (2013.01); *H01L 2224/0391* (2013.01); *H01L 2224/03466* (2013.01); *H01L 2224/05547* (2013.01); *H01L 2224/05571* (2013.01);

(Continued)

(58) Field of Classification Search
CPC .............. H01L 24/03; H01L 21/31053; H01L 21/31116; H01L 21/31133; H01L 21/31138; H01L 24/05
See application file for complete search history.

(56) References Cited

U.S. PATENT DOCUMENTS

| 4,687,552 A * | 8/1987 | Early ............... H01L 21/76879 |
| | | 205/125 |
| 9,604,338 B2 * | 3/2017 | Davis .................... B24B 37/042 |

(Continued)

*Primary Examiner* — Duy Vu N Deo
(74) *Attorney, Agent, or Firm* — Andrew R. Ralston; Charles A. Brill; Frank D. Cimino

(57) ABSTRACT

A microelectronic device is formed by providing a substrate having a recess at a top surface, and a liner layer formed over the top surface of the substrate, extending into the recess. A protective layer is formed over the liner layer, extending into the recess. A CMP process removes the protective layer and the liner layer from over the top surface of the substrate, leaving the protective layer and the liner layer in the recess. The protective layer is subsequently removed from the recess, leaving the liner layer in the recess. The substrate may include an interconnect region with a bond pad and a PO layer having an opening which forms the recess; the bond pad is exposed in the recess. The liner layer in the recess may be a metal liner suitable for a subsequently-formed wire bond or bump bond.

19 Claims, 19 Drawing Sheets

(52) U.S. Cl.
CPC ............... *H01L 2224/0603* (2013.01); *H01L 2224/06102* (2013.01)

(56) References Cited

U.S. PATENT DOCUMENTS

| | | | |
|---|---|---|---|
| 2002/0063337 A1* | 5/2002 | Oizumi | H01L 21/2855 257/762 |
| 2006/0082000 A1 | 4/2006 | Li et al. | |
| 2009/0014869 A1 | 1/2009 | Vrtis et al. | |
| 2011/0298046 A1 | 12/2011 | Hong | |
| 2012/0119364 A1 | 5/2012 | Vaghela | |
| 2014/0264483 A1* | 9/2014 | Yoshida | H01L 21/28079 257/288 |

\* cited by examiner

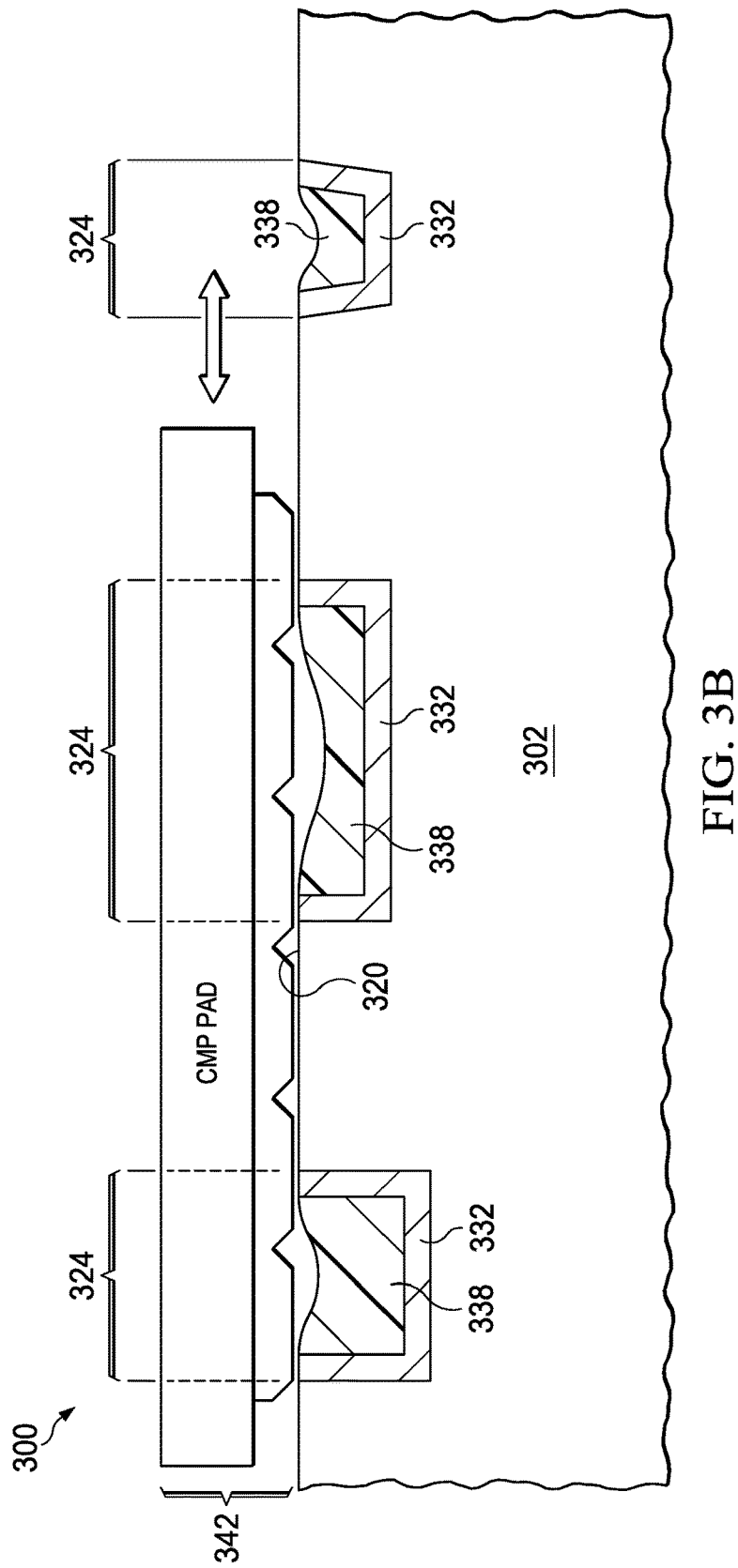

METHOD TO IMPROVE CMP SCRATCH RESISTANCE FOR NON PLANAR SURFACES

CROSS REFERENCE TO RELATED APPLICATIONS

This application is a divisional of U. S. Nonprovisional patent application Ser. No. 14/818,275, filed Aug. 4, 2015, the contents of which are herein incorporated by reference in its entirety.

FIELD OF THE INVENTION

This invention relates to the field of microelectronic devices. More particularly, this invention relates to fabrication methods of microelectronic devices.

BACKGROUND OF THE INVENTION

Some integrated circuits have a protective overcoat (PO) layer over a top metallization layer containing bond pads, with openings in the PO layer exposing the bond pads. The integrated circuits are fabricated by forming a metal liner, suitable for wire bonding, over the PO layer, extending into the PO layer openings and onto the exposed bond pads. The metal liner over the top surface of the PO layer is subsequently removed by a chemical mechanical polish (CMP) process, leaving the metal liner on the bond pads. The CMP process uses a slurry with abrasive particles and corrosive chemicals to remove the metal liner; the abrasive particles and corrosive chemicals attack the metal liner on the bond pads, causing corrosion of the bond pads and reliability problems for the integrated circuit.

Increasing the thickness of the metal liner increases the cost and complexity of the deposition process and the CMP process, and has not demonstrated desired reduction of damage to the metal liner from the CMP slurry. Adding additional pattern steps or plating processes to protect the metal liner also undesirably increase the fabrication cost and complexity. Using thicker top metal increases the difficulty of patterning and limits the minimum features and line separations.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device is formed by forming a PO layer over an interconnect region with a bond pad so that the PO layer has an opening which forms a recess; the bond pad being exposed in the recess. A metal liner is formed over the PO layer, extending into the recess and onto the bond pad. A protective layer is formed over the metal liner, extending into the recess. A CMP process removes the protective layer and the metal liner from over the top surface of the PO layer, leaving the protective layer and the metal liner in the recess. The protective layer is subsequently removed from the recess, leaving the metal liner in the recess over the bond pad.

A microelectronic device is formed by providing a substrate having a recess at a top surface, and a liner layer formed over the top surface of the substrate, extending into the recess. A protective layer is formed over the liner layer, extending into the recess. A CMP process removes the protective layer and the liner layer from over the top surface of the substrate, leaving the protective layer and the liner layer in the recess. The protective layer is subsequently removed from the recess, leaving the liner layer in the recess.

DESCRIPTION OF THE VIEWS OF THE DRAWING

FIG. 3A through FIG. 3C are cross sections of an alternate microelectronic device depicted in successive stages of an example formation sequence.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
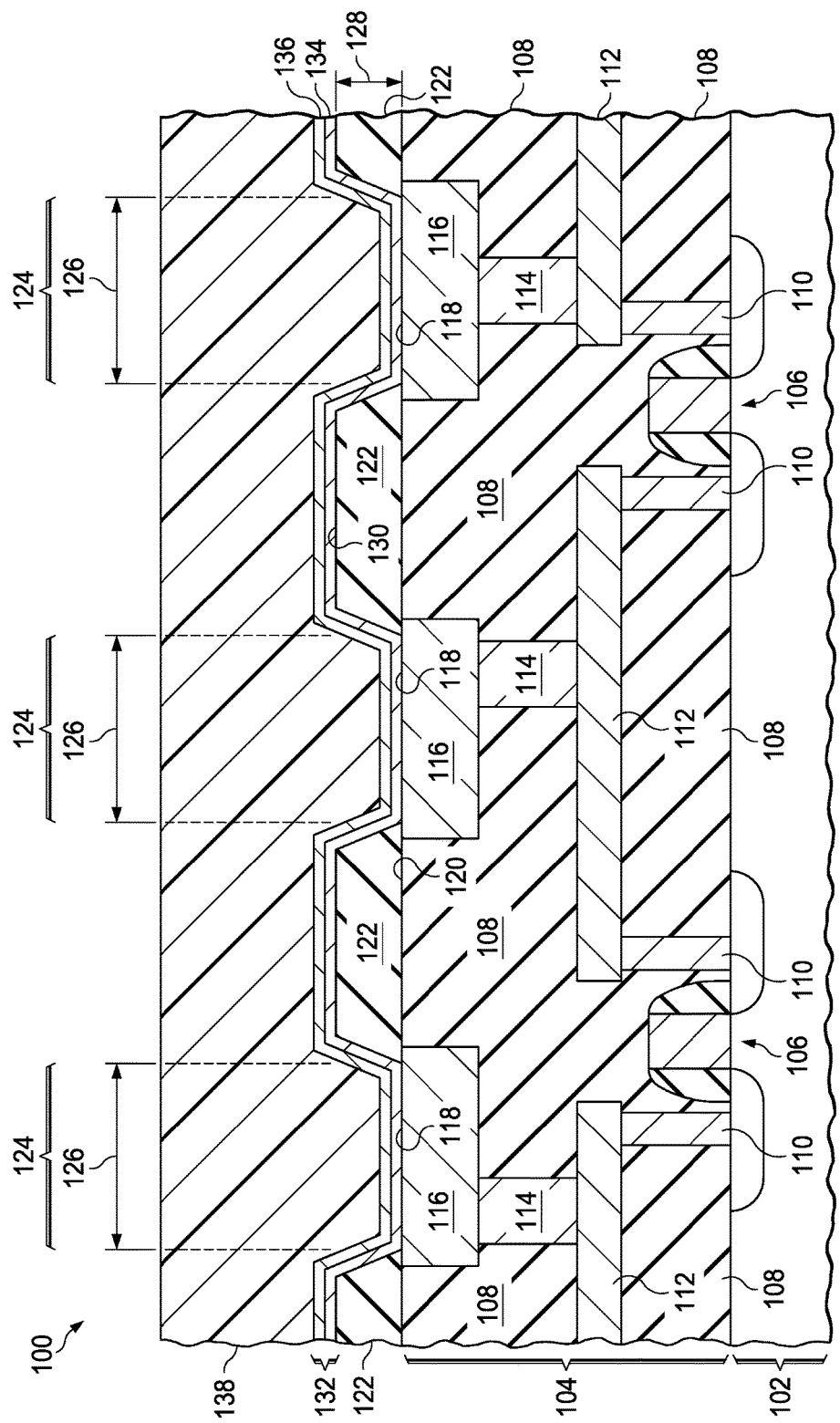
FIG. 1A through FIG. 1G are cross sections of a microelectronic device depicted in successive stages of an example formation sequence.

FIG. 1A through FIG. 1G are cross sections of a microelectronic device depicted in successive stages of an example formation sequence. Referring to FIG. 1A, the microelectronic device 100 includes a substrate 102 and an interconnect region 104 formed over the substrate 102. Active components 106, depicted in FIG. 1A as metal oxide semiconductor (MOS) transistors, are formed in the substrate 102. The interconnect region 104 includes dielectric material 108 such as layers of silicon dioxide-based materials, possibly with silicon nitride layers, silicon carbide nitride, silicon oxynitride or other dielectric layers providing etch stops and cap layers. Contacts 110, metal lines 112, vias 114 and bond pads 116 are formed in the interconnect region 104. The contacts 110 may be formed by etching contact holes in a pre-metal dielectric (PMD) layer of the dielectric material 108 down to the substrate 102, sputtering a layer of titanium on the PMD layer and in the contact holes followed by forming a layer of titanium nitride by atomic layer deposition (ALD). Tungsten is formed on the titanium nitride layer, filling the contact hole, by a metal organic chemical vapor deposition (MOCVD) process. The tungsten, titanium nitride and titanium are removed from a top surface of the PMD layer by a CMP process and/or an etchback process. Other methods of forming the contacts 110 are within the scope of the instant example. The metal lines 112 may be formed with a single damascene copper process by forming a trench mask to expose areas for the metal lines 112, etching interconnect trenches in an intrametal dielectric (IMD) layer of the dielectric material 108 to expose tops of the contacts 110. A liner of tantalum, tantalum nitride, or other suitable metal is formed over the ILD layer and in the interconnect trenches, followed by a layer of sputtered copper to provide an electroplating seed layer. Copper is electroplated on the seed layer, filling the interconnect trenches. The copper and the liner is removed from over a top surface of the ILD layer by a copper CMP process. Alternatively, the metal lines 112 may be formed with an etch-defined process by depositing a metal layer stack of an adhesion layer, an aluminum layer and optionally a cap layer on the PMD layer and the tops of the contacts 110. An interconnect etch mask is formed over the metal layer stack so as to cover areas for the metal lines 112 and the metal layer stack exposed by the interconnect etch mask is removed by a reactive ion etch (RIE) process using chlorine radicals. Dielectric material is subsequently formed between the metal lines 112 to provide the IMD layer. Other methods of forming the metal lines 112 are within the scope of the instant example. The vias 114 may be formed in an interlevel dielectric (ILD) layer of the dielectric material 108 by a process similar to the contact process described herein, or may be formed by a single damascene copper process or a dual damascene copper process, similar to the metal line process described herein. Other methods of forming the vias are within the scope of the instant example. The contacts 110, metal lines 112, vias 114 and bond pads 116 provide electrical connections to the active components 106 and other components, if present, in the microelectronic device 100. The interconnect region 104 may possibly include additional levels of the metal lines 112 and the vias 114.

In the instant example, the bond pads 116 are formed by a single damascene copper process, so that top surfaces 118 of the bond pads 116 are substantially coplanar with a top surface 120 of the dielectric material 108. A PO layer 122 is formed over the top surfaces 118 of the bond pads 116 and the top surface 120 of the dielectric material 108. The PO layer 122 includes one or more layers of dielectric material, such as silicon dioxide, silicon nitride, silicon oxynitride, polyimide and/or other dielectric material. The PO layer 122 is patterned to have recesses 124 which expose portions of the top surfaces 118 of the bond pads 116. The recesses 124 may have widths 126 of, for example, 50 microns to 150 microns, to accommodate typical wire bonds to the bond pads 116. Depths 128 of the recesses 124, which corresponds to a thickness of the PO layer 122, may be, for example, 2 microns to 4 microns. In the instant example, a top surface 130 of the PO layer 122 is substantially planar over the microelectronic device 100 outside of the recesses 124.

A metal liner 132 is formed over the PO layer 122, extending into the recesses 124 and onto the exposed portions of the top surfaces 118 of the bond pads 116. The metal liner 132 on the top surface 118 of the bond pads 116 in the recesses 124 is below the top surface 130 of the PO layer 122 adjacent to the recesses 124. The metal liner 132 may be a layer stack including an adhesion layer 134 contacting the bond pads 116 and a bond layer 136 providing a bonding surface. The adhesion layer 134 may include, for example, titanium, titanium nitride, titanium tungsten, tantalum, tantalum nitride, chromium or nickel. The bond layer 136 may include, for example, aluminum, palladium, ruthenium, platinum, or gold. The metal liner 132 may optionally include one or more metal layers, such as palladium, aluminum or nickel, between the adhesion layer 134 and the bond layer 136. The metal liner 132 may be 100 nanometers to 3 microns thick, advantageously providing low process cost for the metal liner 132 formation compared to thicker metal liners. The layers of the metal liner 132 may be formed by any combination of sputtering, evaporation, electroplating, electroless plating, ALD, reactive sputtering, MOCVD or other thin film formation method.

A layer of protective material 138 is formed over the metal liner 132. In the instant example, the layer of protective material 138 may be an organic polymer material such as photoresist or novolac resin, mixed with a solvent. The layer of protective material 138 may be dispensed in a thick layer which fills the recesses 124, as part of a spin coat process. The layer of protective material 138 may be a material which is used in other processes in the fabrication sequence for the microelectronic device 100, and the method of forming the layer of protective material 138 may use equipment which is used in other processes in the fabrication sequence for the microelectronic device 100, thus advantageously eliminating a need to install dedicated equipment and provide dedicated material to form the layer of protective material 138.

Figure 1B:
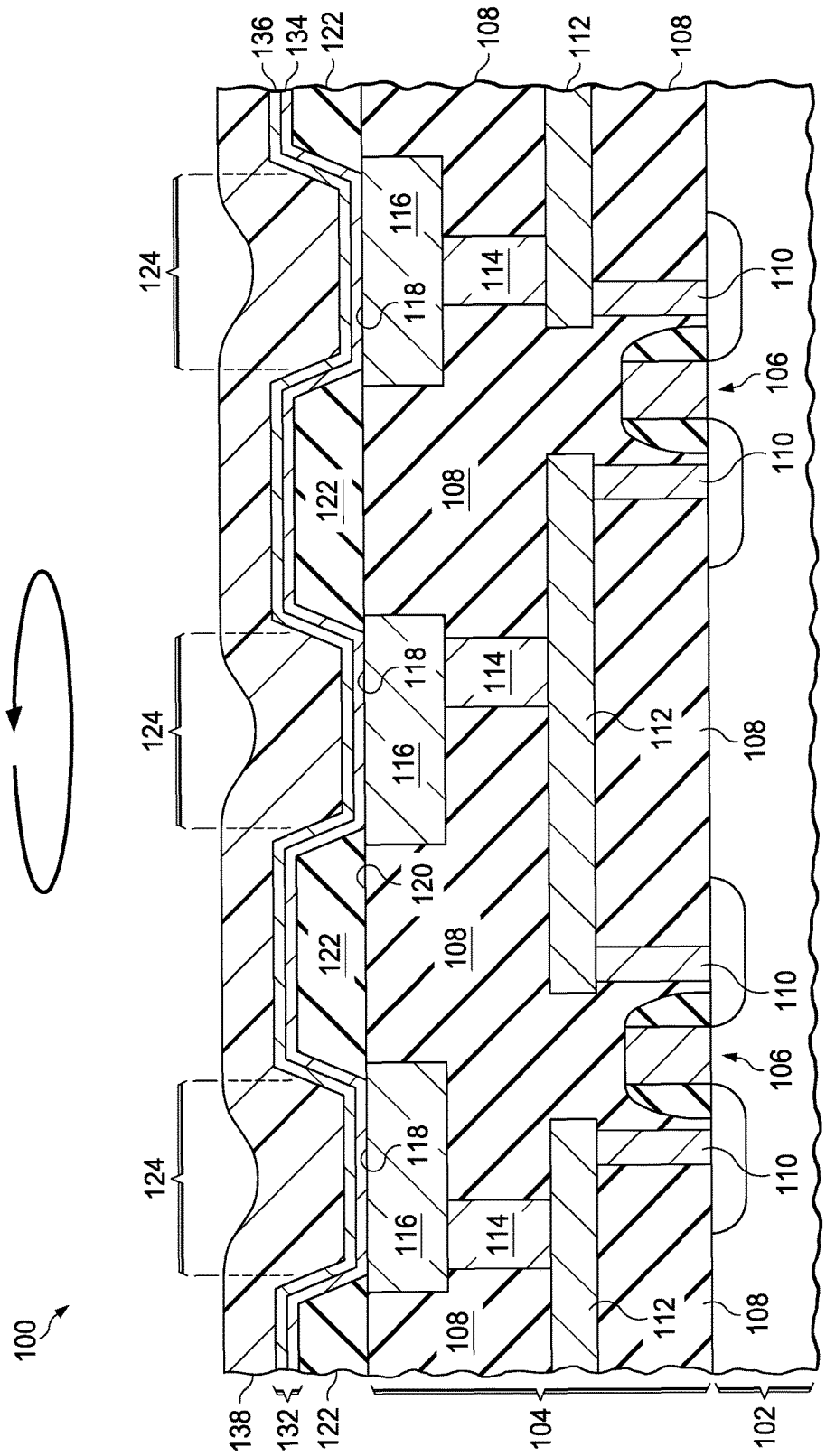

Referring to FIG. 1B, the substrate 102 is rotated at a spin speed of 10 revolutions per minute (rpm) to 100 rpm as part of the spin coat process, to distribute the layer of protective material 138. Subsequently the substrate 102 is rotated at a higher spin speed as part of the spin coat process, for example 500 rpm to 2,000 rpm, to obtain a desired thickness of the layer of protective material 138, which is a few microns. A portion of the solvent evaporates during the spin process, so that the layer of protective material 138 may dip in the recesses 124.

Figure 1C:
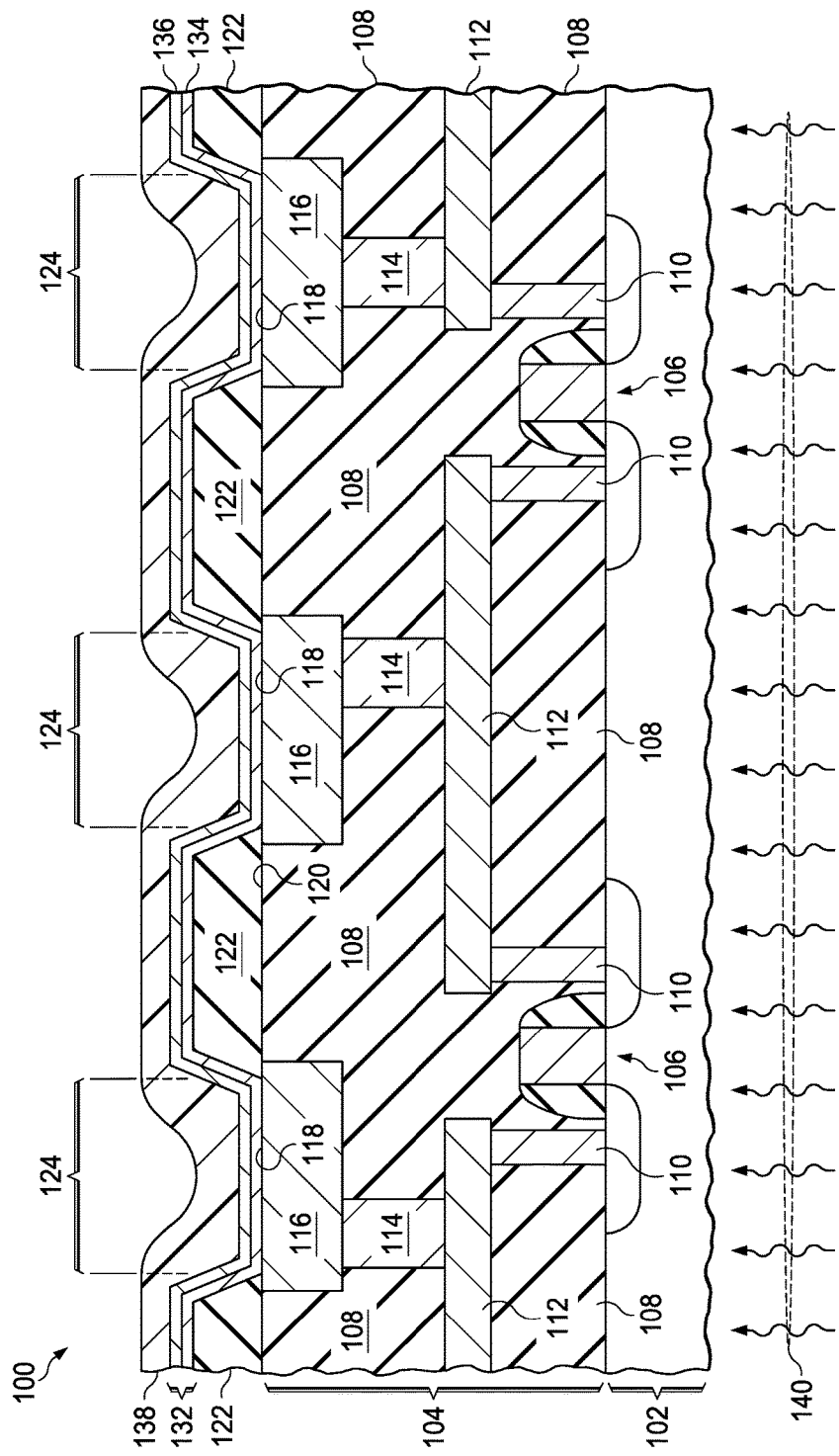

Referring to FIG. 1C, the layer of protective material 138 is heated to 100° C. to 200° C. as part of a bake process to remove more solvent and to provide a desired CMP removal rate. The layer of protective material 138 may be heated by applying heat 140 to the substrate 102 from a hot plate or oven chamber. The layer of protective material 138 is continuous over the metal liner 132 after the bake process is completed. The layer of protective material 138 may be, for example 1 micron to 3 microns thick over the PO layer 122 away from the recesses 124. In the instant example, the layer of protective material 138 is not patterned through a process using a photolithographic operation, advantageously reducing fabrication cost and complexity of the microelectronic device 100.

Figure 1D:
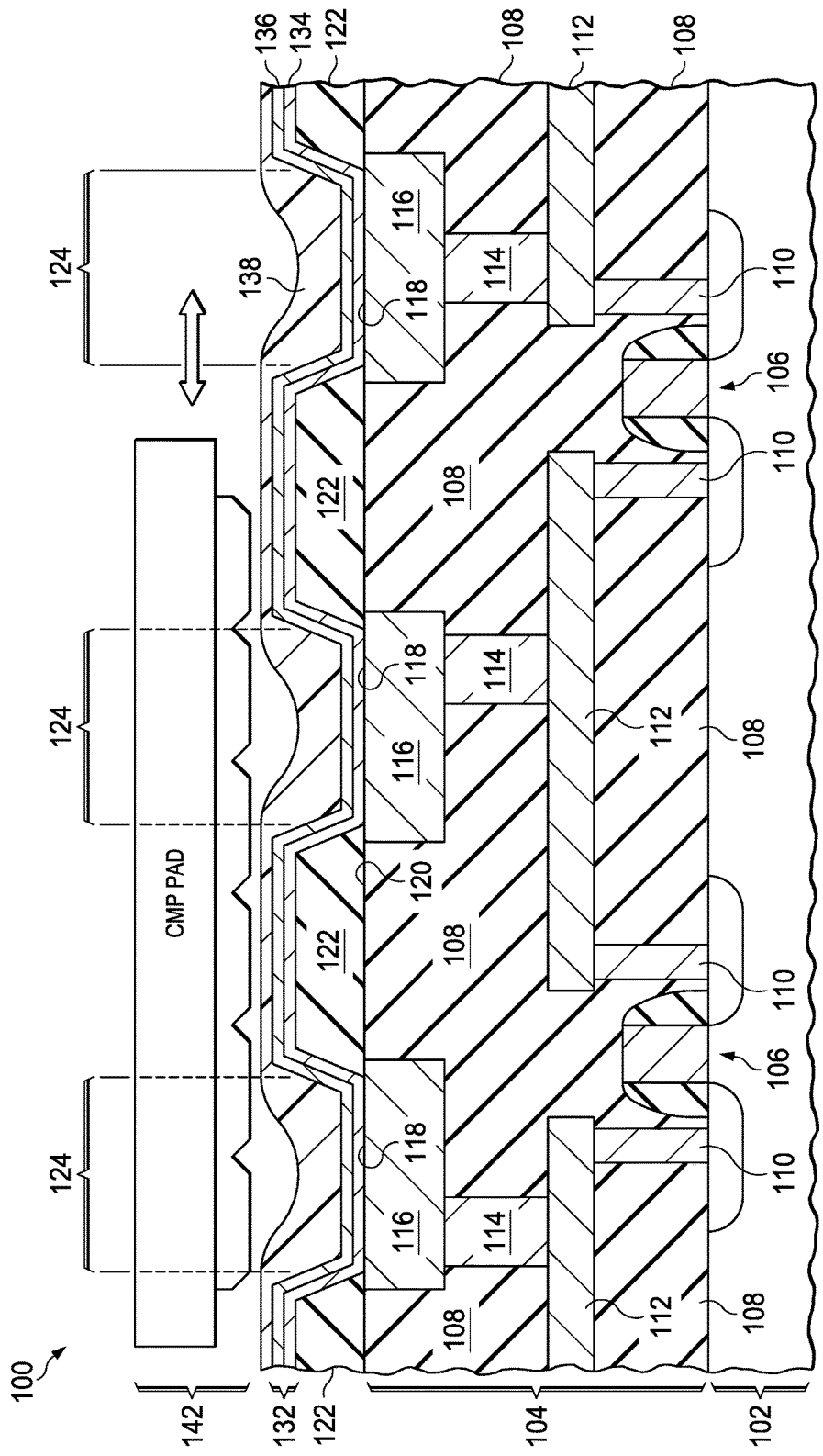

Referring to FIG. 1D, a CMP process 142 removes the layer of protective material 138 over the PO layer 122 while leaving a portion of the protective material 138 in the recesses 124. The CMP process 142 may use a slurry which includes both abrasive particles, such as silica or ceria, and corrosive chemicals. The slurry may be acidic with a pH value of 2 to 5, for example. Alternatively, the slurry may be caustic with a pH value of 9 to 12, for example. FIG. 1D depicts the CMP process 142 partway to completion.

Figure 1E:
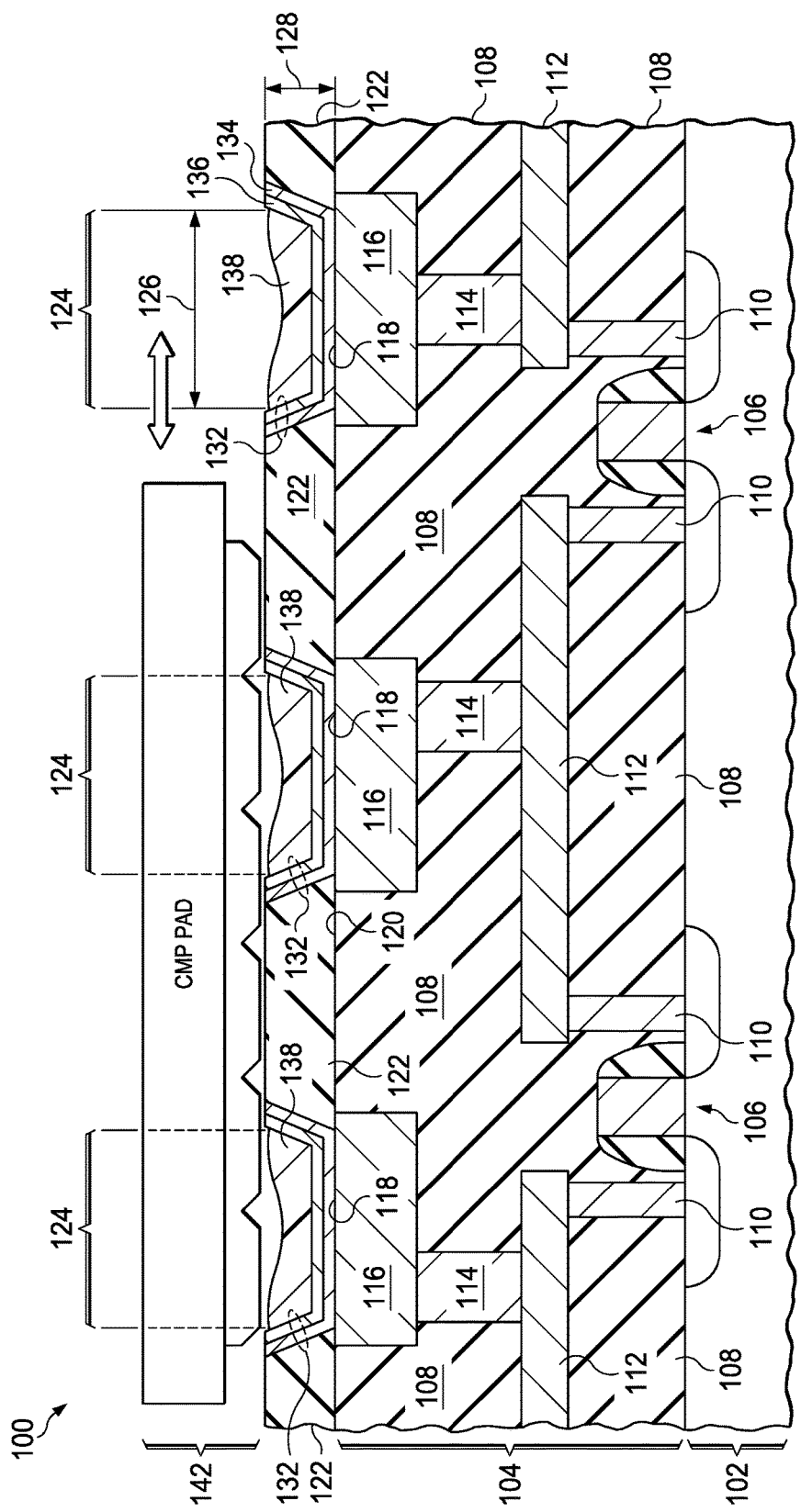

Referring to FIG. 1E, the CMP process 142 removes the layer of protective material 138 and the metal liner 132 from over the PO layer 122 outside the recesses 124, while leaving the metal liner 132 and at least a portion of the protective material 138 in the recesses 124. The CMP process 142 may be timed or endpointed. The CMP process 142 may possibly alter the chemicals or abrasives in the slurry after removing the layer of protective material 138 to obtain a desired selectivity in removing the metal liner 132 from over the PO layer 122. The protective material 138 in the recesses 124 advantageously protects the metal liner 132 from both the abrasive particles and the corrosive chemicals in the slurry of the CMP process 142, allowing more process latitude for an aggressive the CMP process 142 and thus providing a lower cost for the CMP process 142. FIG. 1E depicts the CMP process 142 at completion. As disclosed in reference to FIG. 1A, the recesses 124 may have widths 126 of 50 microns to 150 microns, and depths 128 of 2 microns to 4 microns. The metal liner 132 in the recesses 124 is protected from the CMP slurry in the instant example, whereas metal liners in recesses with these dimensions without the protective material have demonstrated degradation from the CMP slurry.

Figure 1F:
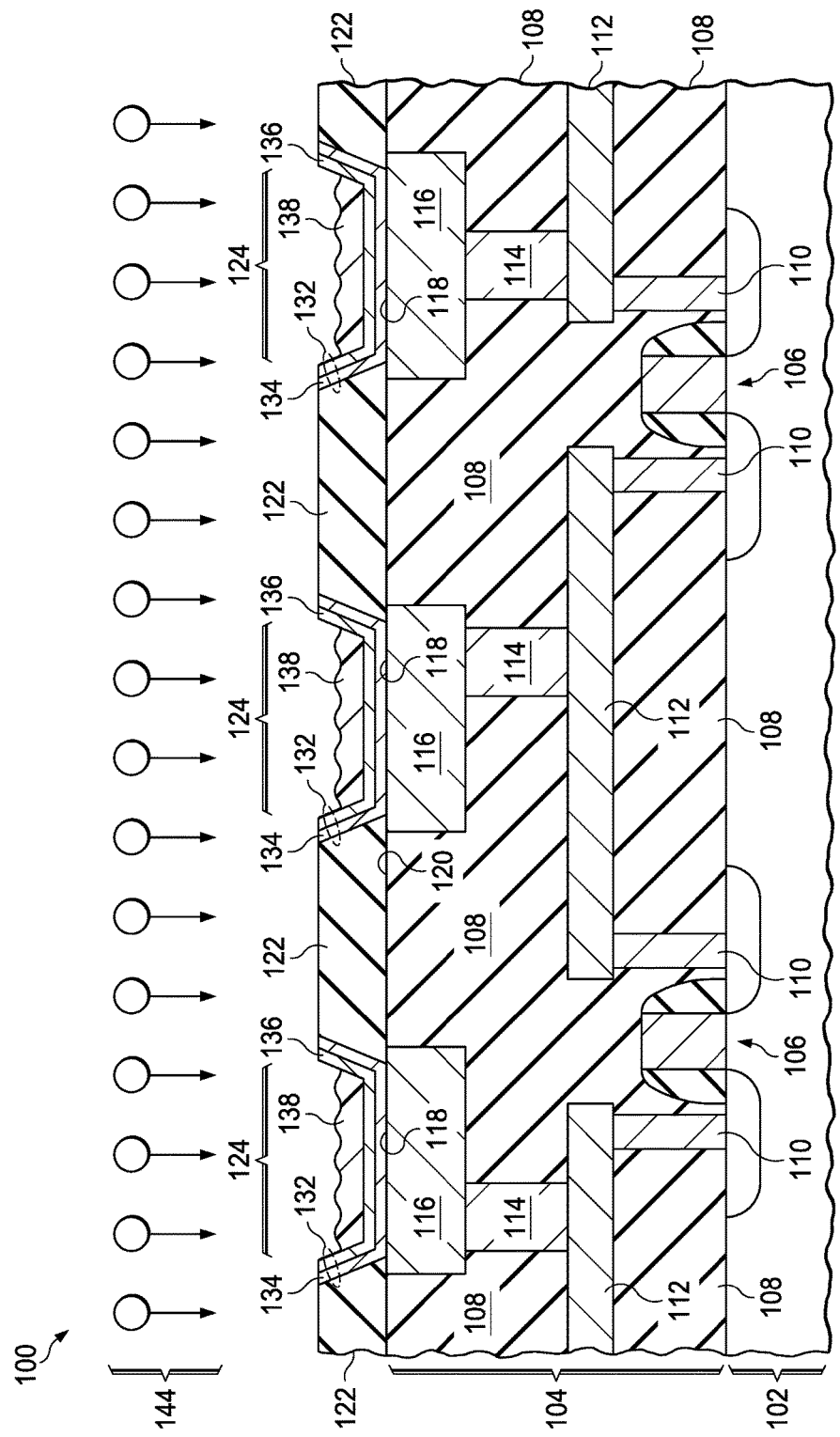

Referring to FIG. 1F, the protective material 138 is removed from the recesses 124. In the instant example, the protective material 138 may be removed by an ash process 144 using oxygen radicals. The ash process 144 may be followed by a wet clean to remove any residue. The metal liner 132 remains in the recesses 124. Other methods for removing the protective material 138 from the recesses 124 are within the scope of the instant example.

Figure 1G:
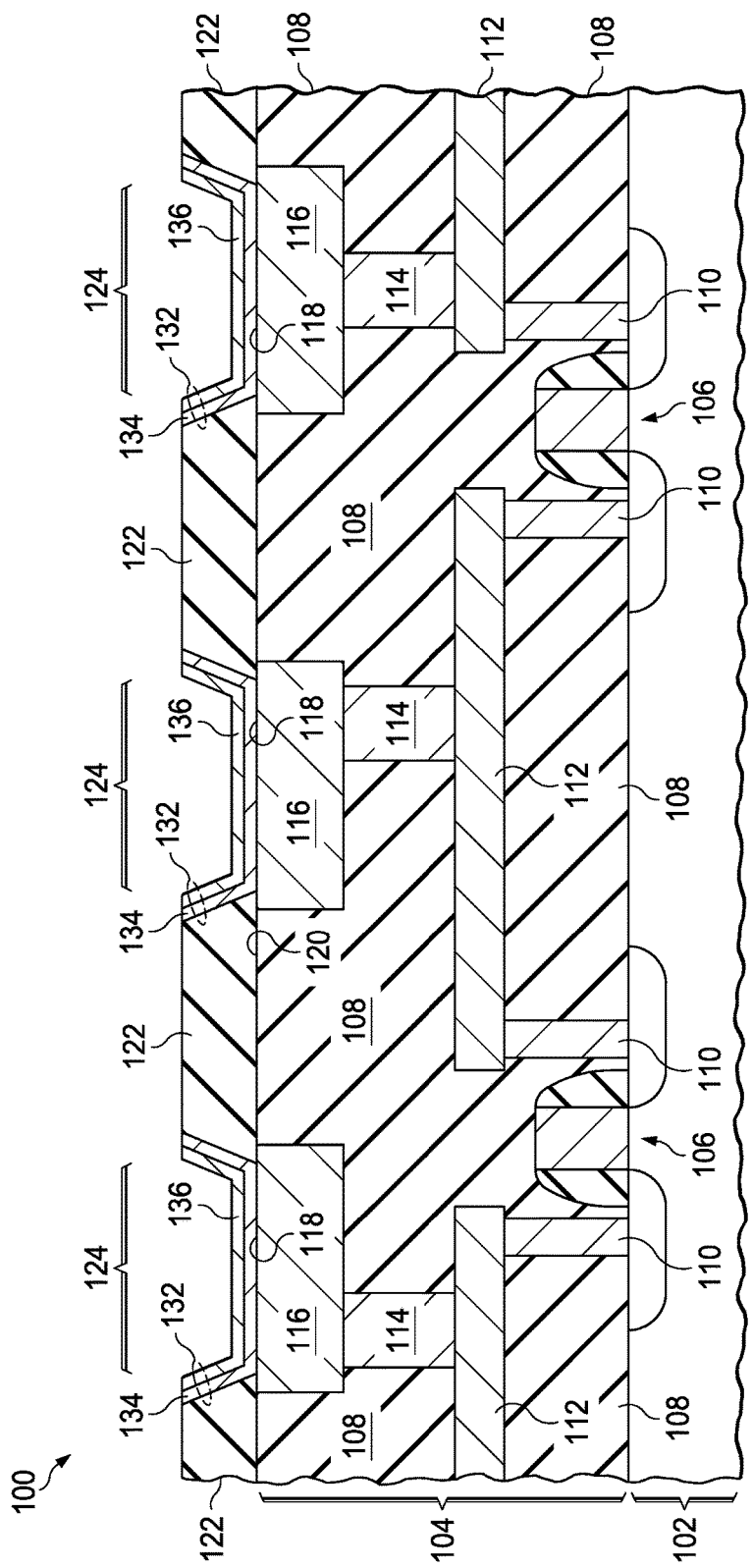

FIG. 1G depicts the microelectronic device 100 after the protective material 138 of FIG. 1F has been removed. The metal liner 132 in the recesses 124 may be advantageously free of cracks, corrosion and scratches as a result of being protected during the CMP process of FIG. 1D and FIG. 1E by the protective material 138. Wire bonds or bump bonds may be formed on the metal liner 132 in the recesses 124.

Figure 2A:
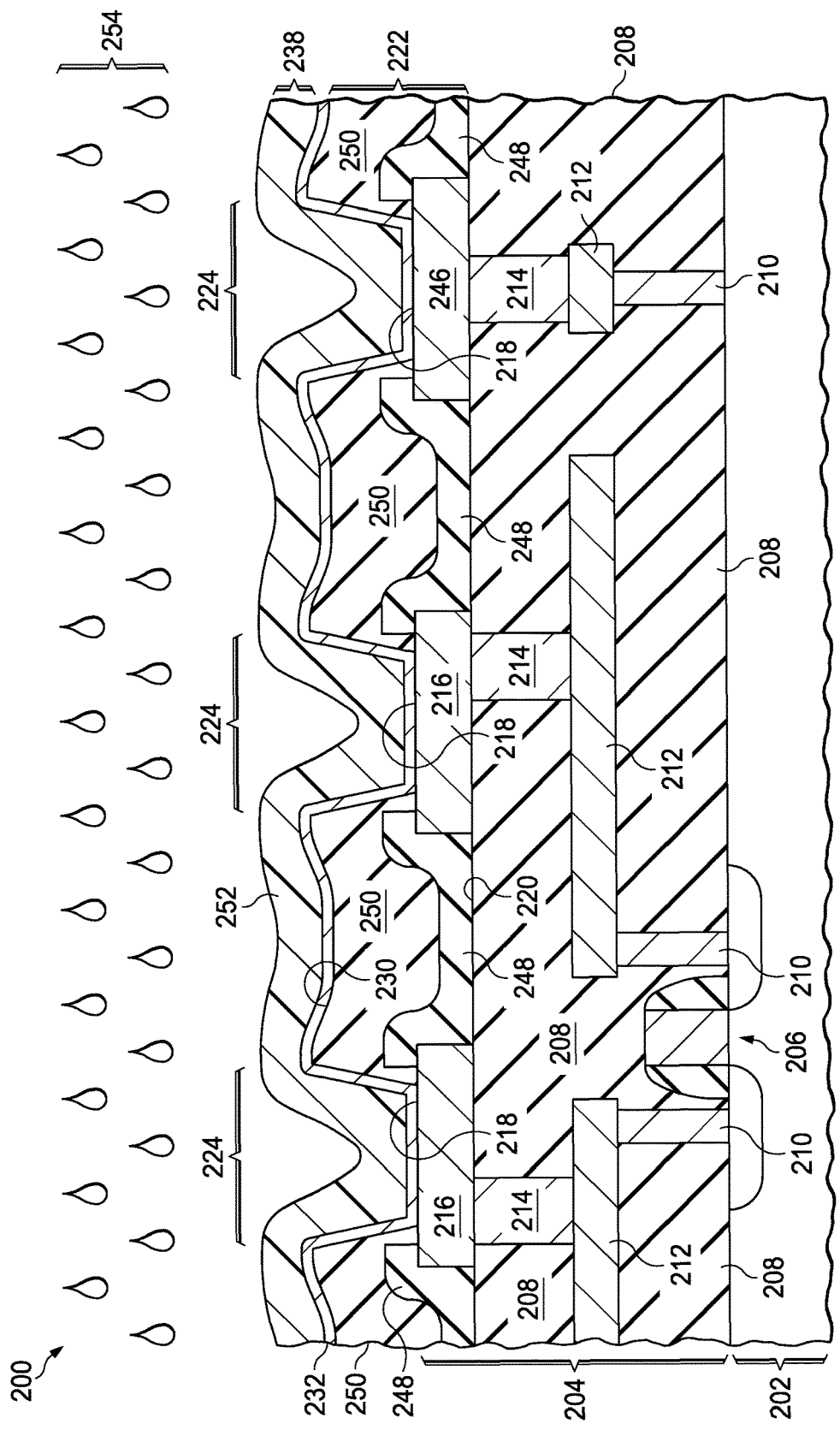
FIG. 2A through FIG. 2I are cross sections of another microelectronic device depicted in successive stages of an example formation sequence.

FIG. 2A through FIG. 2I are cross sections of another microelectronic device depicted in successive stages of an example formation sequence. Referring to FIG. 2A, the microelectronic device 200 includes a substrate 202 and an interconnect region 204 formed over the substrate 202. An active component 206, depicted in FIG. 2A as an MOS transistor, is formed in the substrate 202. The interconnect region 204 includes layer of dielectric material 208, with contacts 210, one or more levels of metal lines 212, one or more levels of vias 214 and bond pads 216, formed in the interconnect region 204. The bond pads 216 are electrically coupled to the active component 206 and other active components, if present, in the microelectronic device 200, through the contacts 210, metal lines 212 and vias 214. The microelectronic device 200 may optionally include dummy bond pads 246 which are formed concurrently with the bond pads 216 and are disposed so as to provide a more uniform distribution of the combined bond pads 216 and dummy bond pads 246, which may advantageously improve uniformity and process latitude of processes used to form the bond pads 216, and subsequent metal liners on the bond pads 216. The dummy bond pads 246 may optionally be electrically coupled to the substrate 202 through some of the contacts 210, metal lines 212 and vias 214.

In the instant example, the bond pads 216 are formed by an etch-defined process, so that top surfaces 218 of the bond pads 216 are higher than a top surface 220 of the dielectric material 208. A PO layer 222, comprising a first PO sub-layer 248 and a second PO sub-layer 250, is formed over the top surfaces 218 of the bond pads 216 and the top surface 220 of the dielectric material 208. The first PO sub-layer 248 includes one or more layers of inorganic dielectric material, such as silicon dioxide, silicon nitride and/or silicon oxynitride. The second PO sub-layer 250 is formed over the first PO sub-layer 248. The second PO sub-layer 250 includes organic dielectric material such as polyimide. The PO layer 222 is patterned to have recesses 224 which expose portions of the top surfaces 218 of the bond pads 216 and the dummy bond pads 246. In the instant example, a top surface 230 of the PO layer 222 is not planar over the microelectronic device 200 outside of the recesses 224.

A metal liner 232 is formed over the PO layer 222, extending into the recesses 224 and onto the bond pads 216 and dummy bond pads 246. The metal liner 232 on the top surface 218 of the bond pads 216 and dummy bond pads 246 in the recesses 224 is below the top surface 230 of the PO layer 222 adjacent to the recesses 224. The metal liner 232 may be a single metal layer or layer stack including an adhesion layer and a bond layer. The metal liner 232 may include, for example, the metals listed in reference to FIG. 1A. The metal liner 232 may be 100 nanometers to 3 microns thick, advantageously providing low process cost for the metal liner 232 formation compared to thicker metal liners. The metal liner 232 may be formed by any combination of sputtering, evaporation, electroplating, ALD, reactive sputtering, MOCVD or other thin film formation method.

A first sub-layer 252 of a layer of protective material 238 is formed over the metal liner 232. In the instant example, the first sub-layer 252 may be an organic polymer material, mixed with a solvent. The first sub-layer 252 may be applied by a first spray process 254; the first sub-layer 252 extends into the recesses 224 and onto the bond pads 216 and the dummy bond pads 246. Spray application of the first sub-layer 252 may advantageously provide more uniform coverage for a large or irregularly shaped substrate 202 compared to spin coating. The first sub-layer 252 may use material and equipment which are used in other processes in the fabrication sequence for the microelectronic device 200, accruing the advantage discussed in reference to FIG. 1A.

Figure 2B:
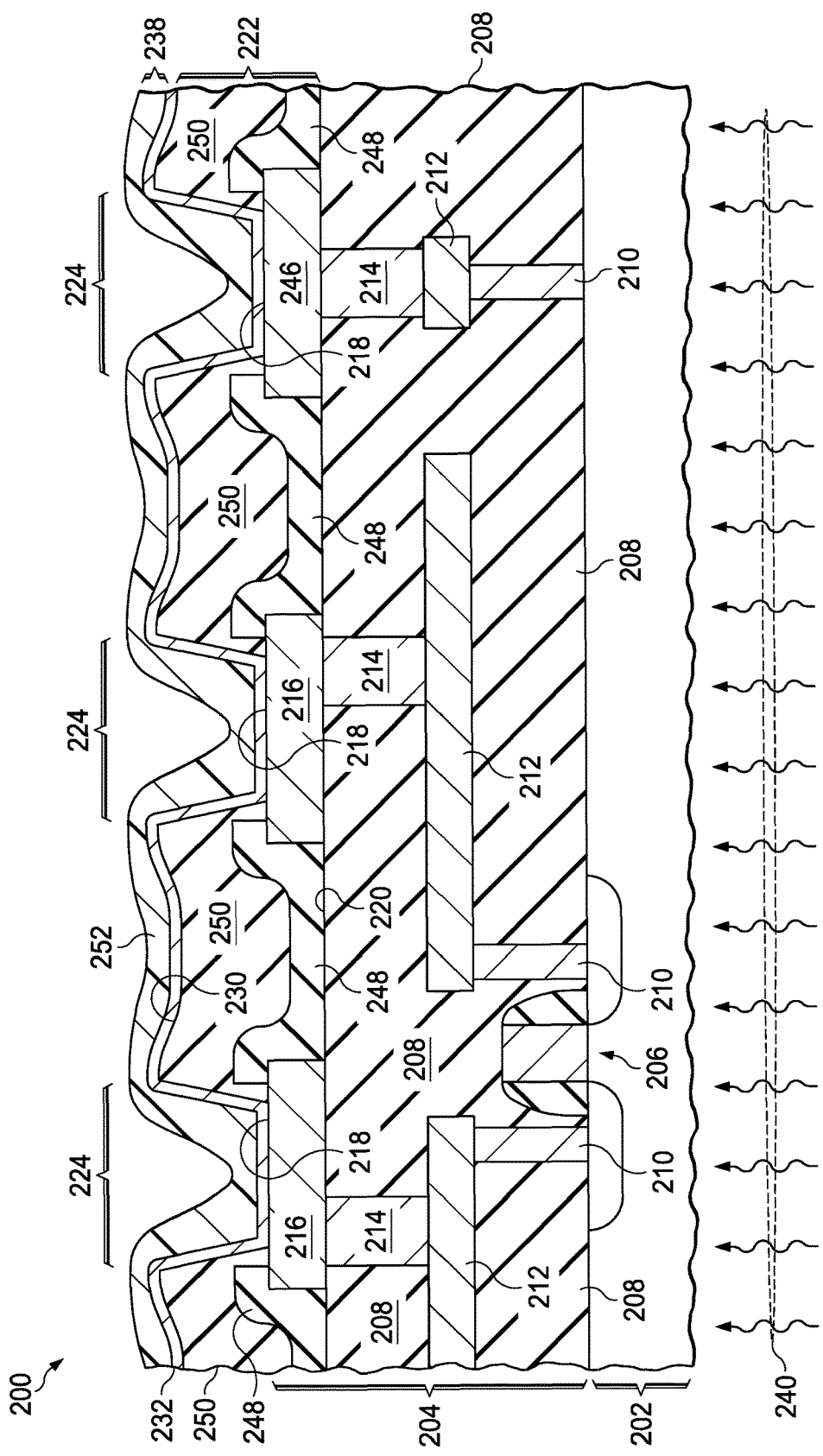

Referring to FIG. 2B, the first sub-layer 252 of the layer of protective material 238 is heated to 100° C. to 200° C. as part of a bake process to remove solvent and to provide a desired CMP removal rate. The first sub-layer 252 may be heated by applying heat 240 to the substrate 202 from a hot plate or oven chamber. The first sub-layer 252 is continuous over the metal liner 232 after the bake process is completed. The first sub-layer 252 may be, for example 1 micron to 2 microns thick over the PO layer 222 away from the recesses 224.

Figure 2C:
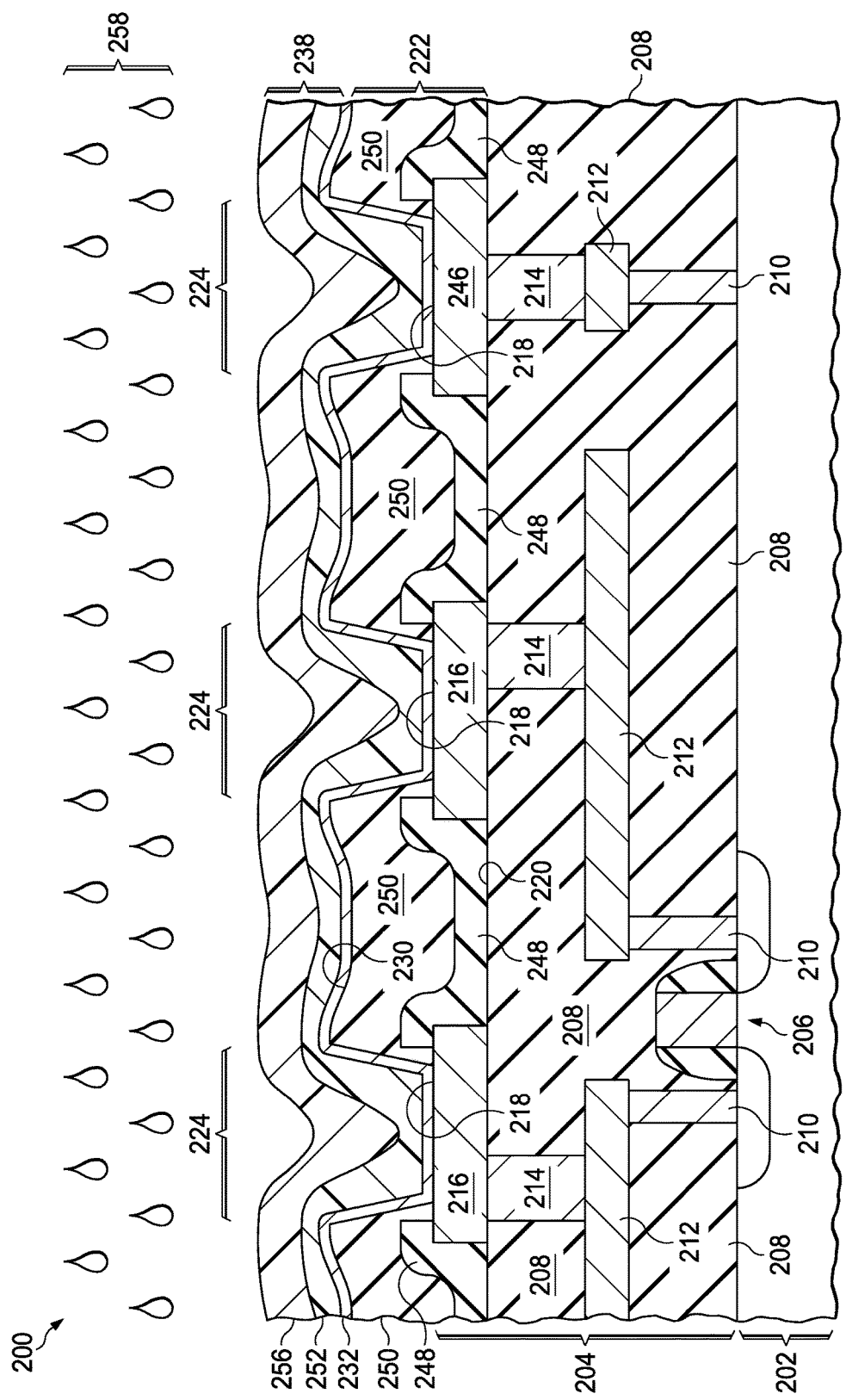

Referring to FIG. 2C, a second sub-layer 256 of the layer of protective material 238 is formed over the first sub-layer 252. The second sub-layer 256 may be an organic polymer material that is the same as the first sub-layer 252. Alternatively, the second sub-layer 256 may use a different material from the first sub-layer 252. The second sub-layer 256 may also be dispensed by a second spray process 258; the second sub-layer 256 covers the first sub-layer 252 in the recesses 224.

Figure 2D:
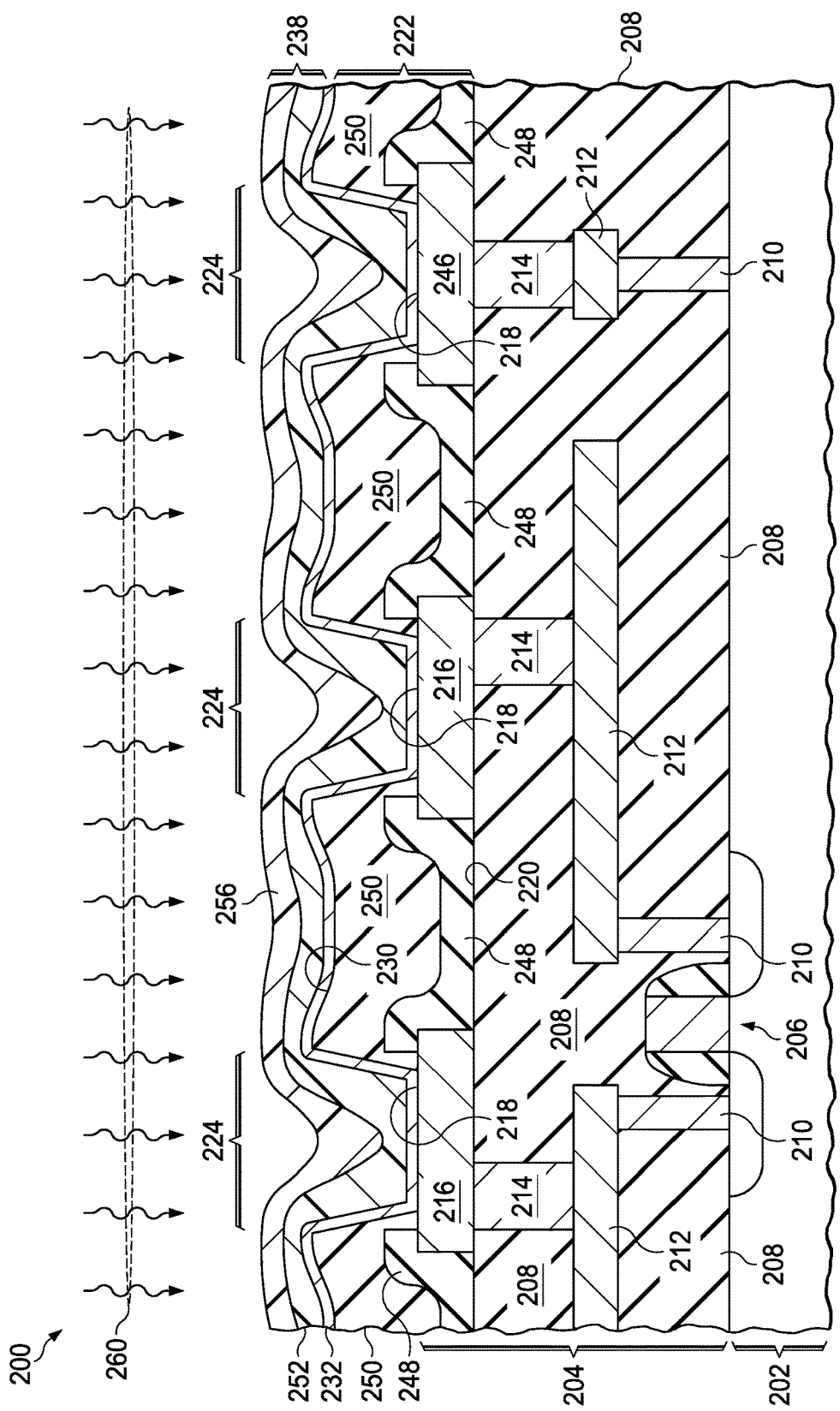

Referring to FIG. 2D, the first sub-layer 252 and the second sub-layer 256 of the layer of protective material 238 are heated to 100° C. to 200° C. as part of a bake process to remove solvent and to provide a desired CMP removal rate. The first sub-layer 252 and the second sub-layer 256 may be heated by applying infrared radiation 260 from a heat lamp. The first sub-layer 252 and the second sub-layer 256 are both continuous over the metal liner 232 after the bake process is completed. The layer of protective material 238 may be, for example 2 micron to 4 microns thick over the PO layer 222 away from the recesses 224. The second sub-layer 256 and first sub-layer 252 combined may advantageously provide more protection for the metal liner 232 in the recesses 224 during a subsequent CMP process than a single layer alone.

Figure 2E:
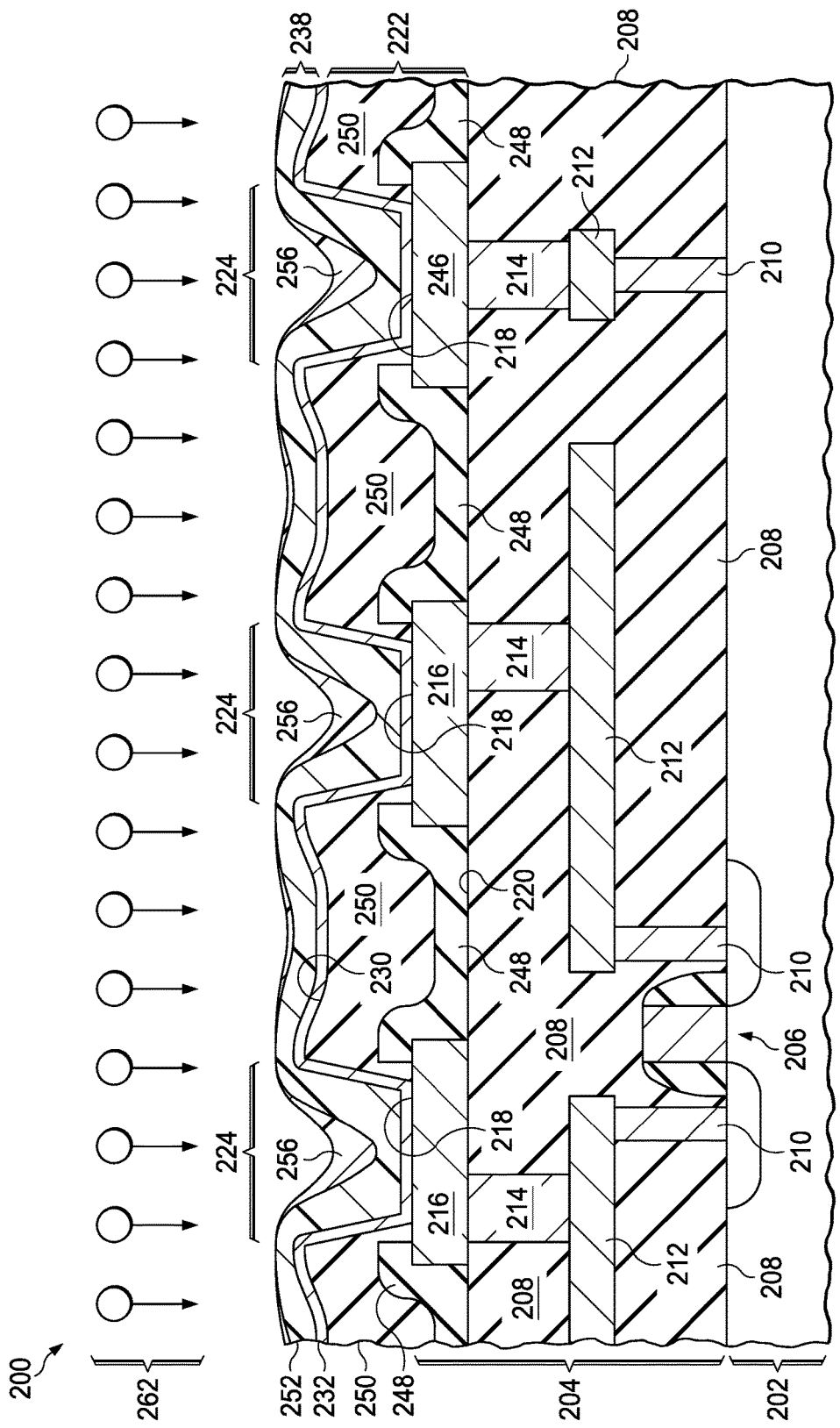

Referring to FIG. 2E, an etchback process 262 removes a portion of the layer of protective material 238 across the microelectronic device 200. The etchback process 262 may include, for example, an RIE process using oxygen radicals. A substantially uniform amount of the layer of protective material 238 may be removed across the microelectronic device 200, advantageously reducing an amount of the layer of protective material 238 to be removed in a subsequent CMP process. In the instant example, the etchback process 262 may not expose the metal liner 232.

Figure 2F:
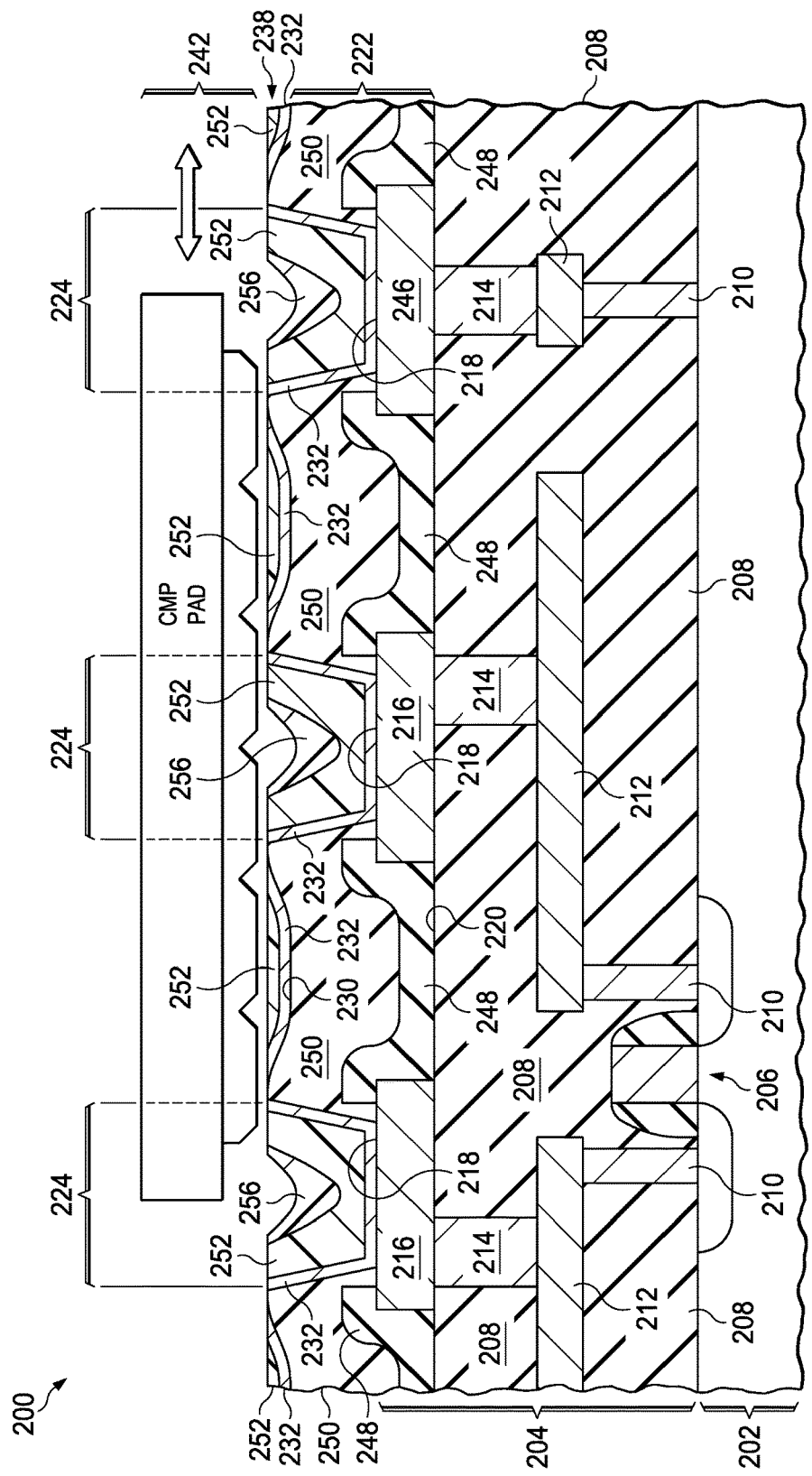

Referring to FIG. 2F a CMP process 242 removes the layer of protective material 238, which in the instant example comprise the first sub-layer 252 and the second sub-layer 256, and the metal liner 232 from over the PO layer 222 while leaving a portion of the second sub-layer 256, and possibly a portion of the first sub-layer 252, in the recesses 224. The CMP process 242 may use a slurry which includes both abrasive particles, such as silica or ceria, and corrosive chemicals, as described in reference to FIG. 1D. The dummy bond pads 246 may advantageously improve uniformity of the CMP process 242. FIG. 2F depicts the CMP process 242 partway to completion.

Figure 2G:
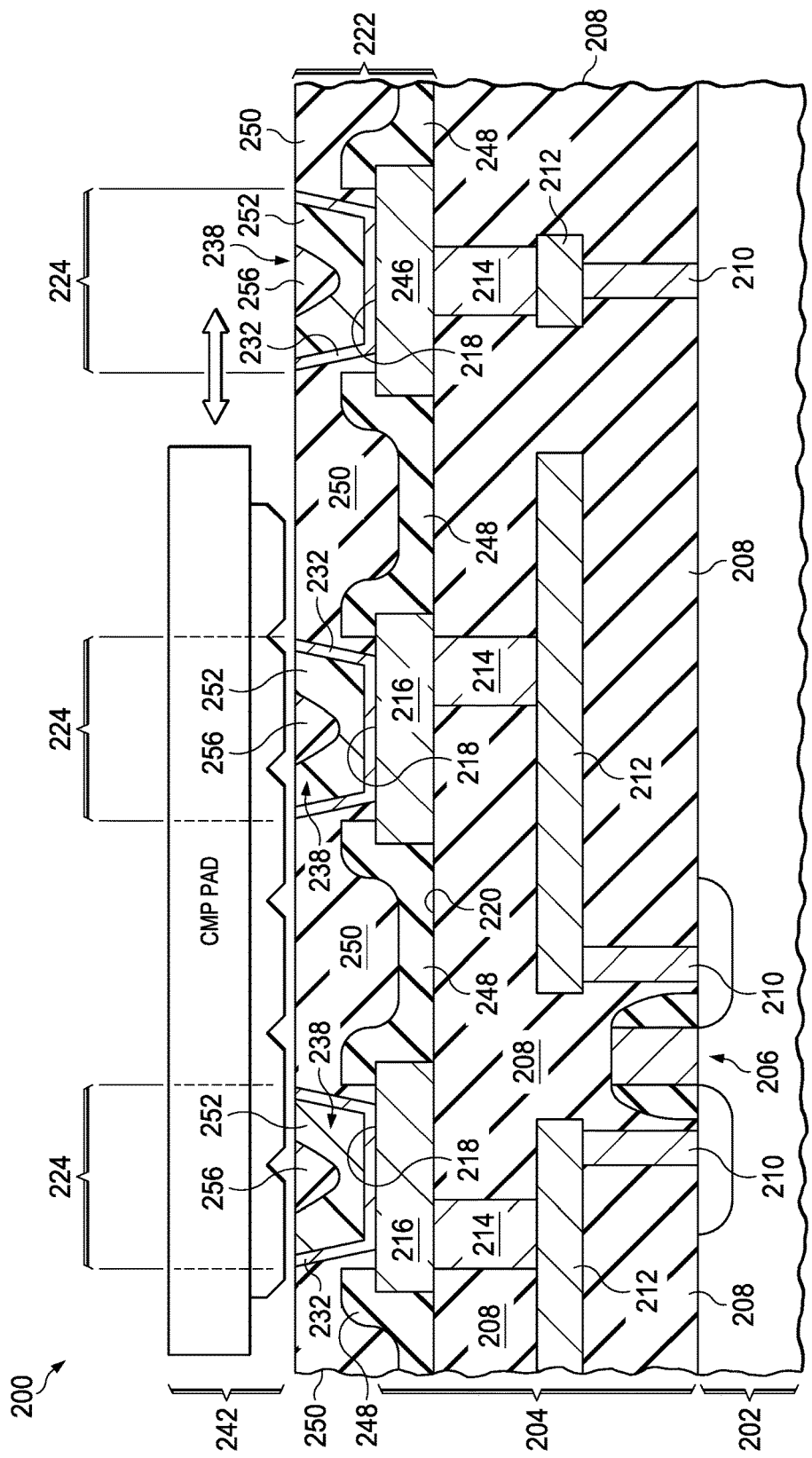

Referring to FIG. 2G, the CMP process 242 removes the first sub-layer 252 and the second sub-layer 256 of the layer of protective material 238 and the metal liner 232 from over the PO layer 222 outside the recesses 224, while leaving the metal liner 232 and at least a portion of the first sub-layer 252 in the recesses 224. The CMP process 242 may also remove a portion of the PO layer 222, for example a portion of the second PO sub-layer 250, immediately under the metal liner 232, if the original top surface 230 of FIG. 2D of the PO layer 222 outside the recesses 224 is not planar. Forming the second PO sub-layer 250 of an organic material such as polyimide with a high CMP removal rate compared to the inorganic dielectric material in the first PO sub-layer 248 advantageously facilitates removal of all of the metal liner 232 outside of the recesses 224. The protective material 238 in the recesses 224 advantageously protects the metal liner 232 from both the abrasive particles and the corrosive chemicals in the slurry of the CMP process 242, allowing more process latitude for an aggressive CMP process 242 and thus providing a lower cost for the CMP process 242. FIG. 2G depicts the CMP process 242 at completion.

Figure 2H:
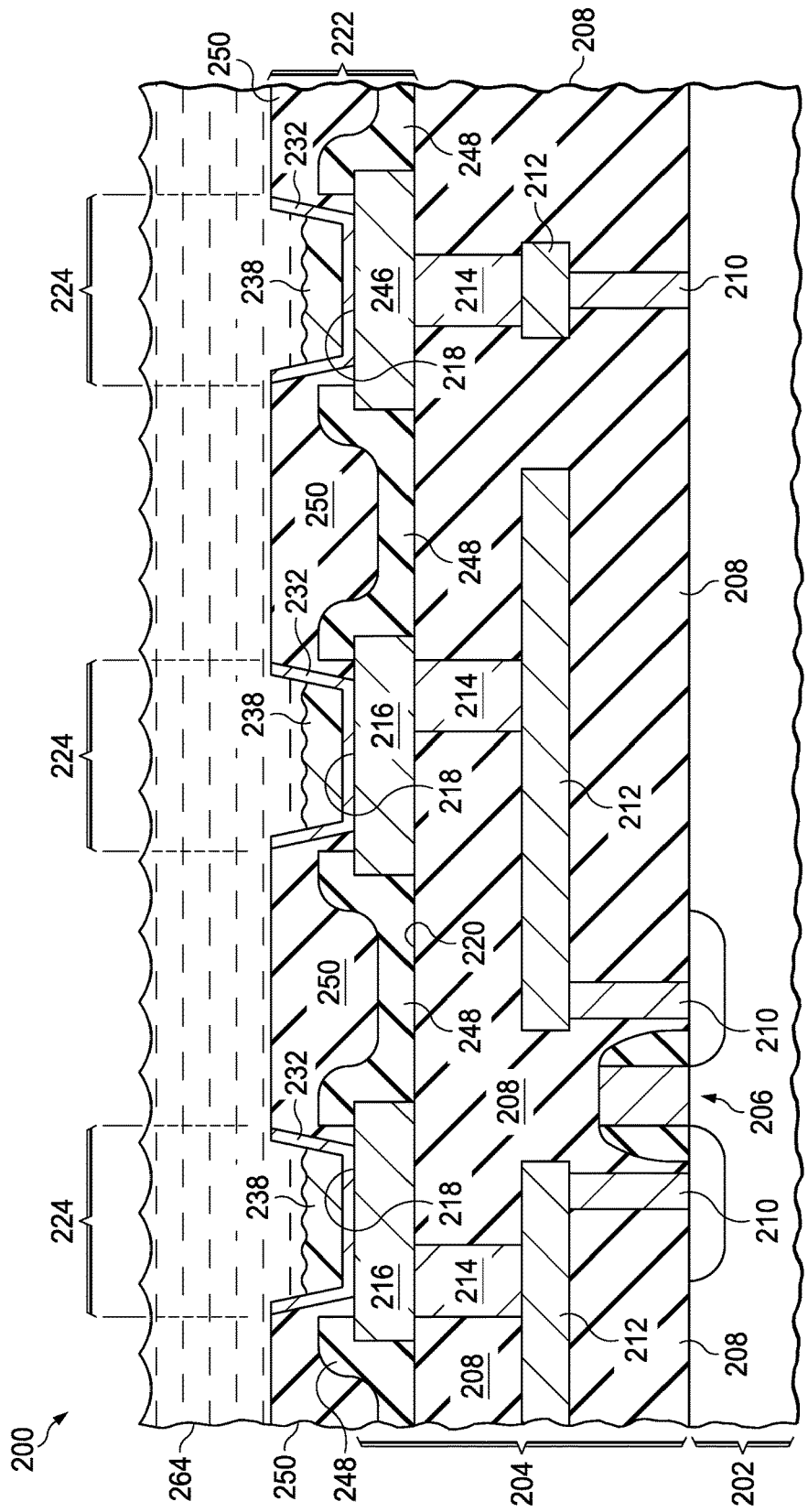

Referring to FIG. 2H, the protective material 238 is removed from the recesses 224. In the instant example, the protective material 238 is removed by a wet dissolution process 264. The wet dissolution process 264 may use an organic solvent such as propylene glycol monomethyl ether acetate (PGMEA). Alternatively, the wet dissolution process 264 may use an aqueous solution of a weak acid or a weak base. The metal liner 232 remains in the recesses 224. Other methods for removing the protective material 238 from the recesses 224 are within the scope of the instant example. For example, protective material 238 comprising positive tone photoresist may be removed by a blanket exposure followed by a develop process, and a subsequent descum ash process to remove residue.

Figure 2I:
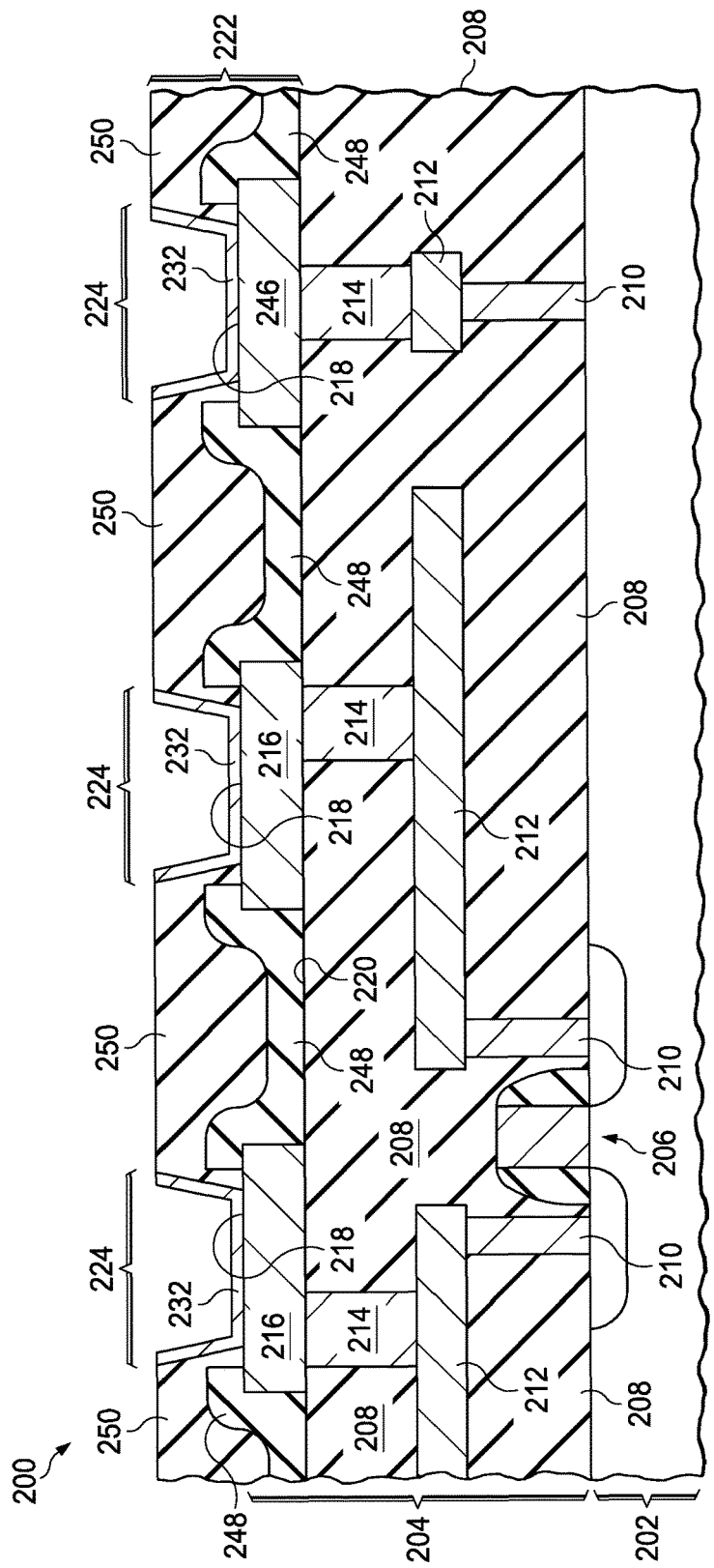

FIG. 2I depicts the microelectronic device 200 after the protective material 238 of FIG. 2H has been removed. The metal liner 232 in the recesses 224 may be advantageously free of cracks, corrosion and scratches as a result of being protected during the CMP process of FIG. 2F and FIG. 2G by the protective material 238. Wire bonds or bump bonds may be formed on the metal liner 232 in the recesses 224.

Figure 3A:
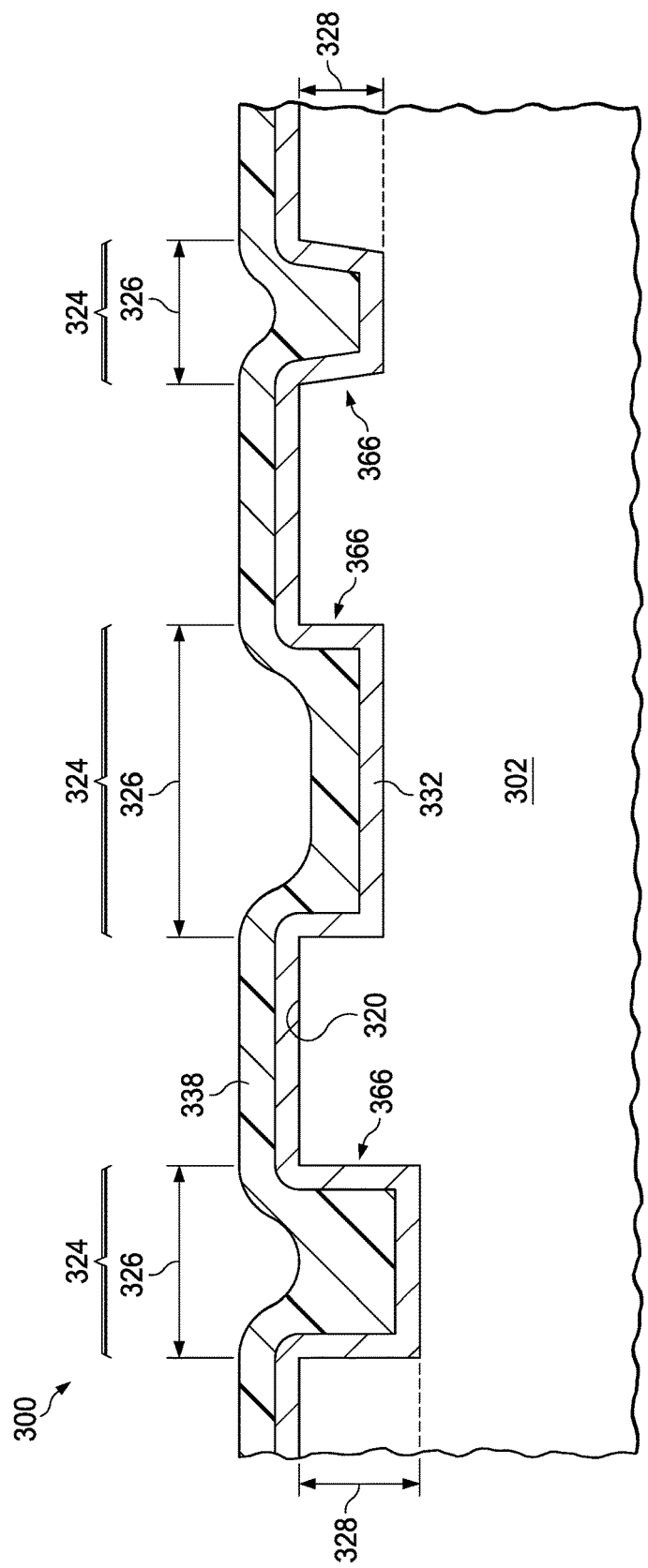
Figure 3C:
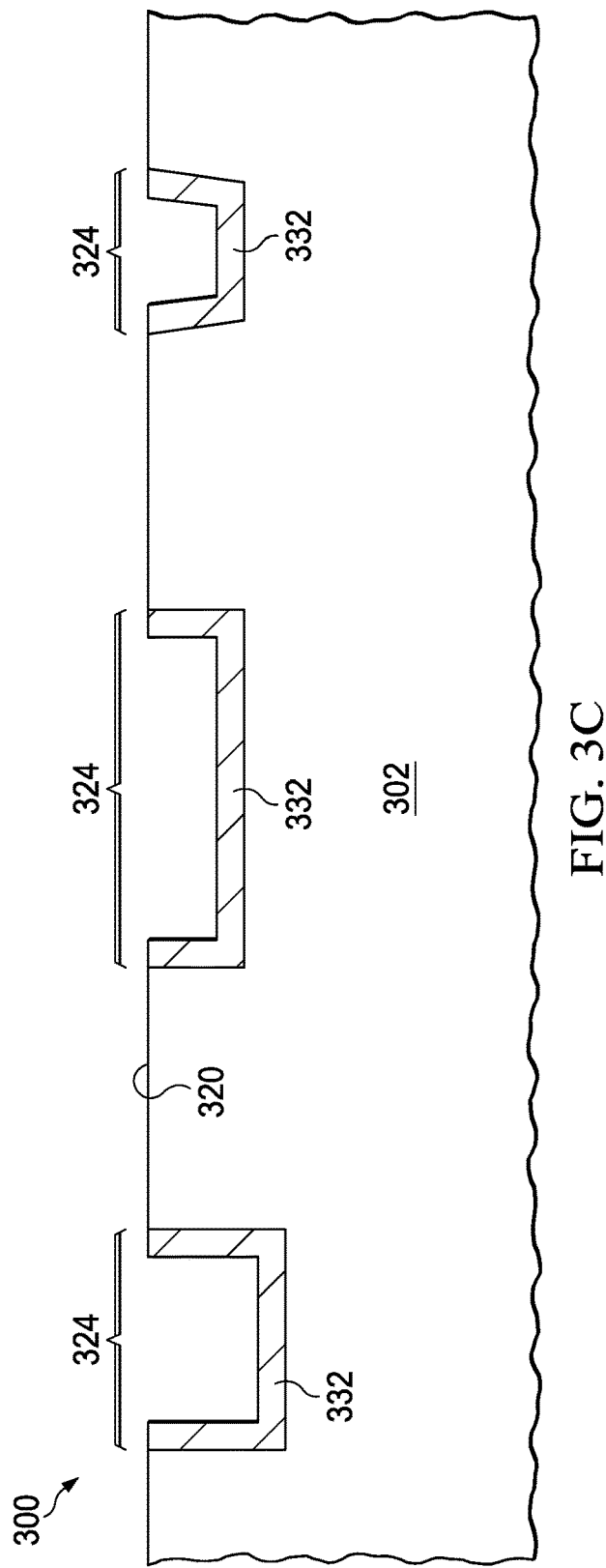

FIG. 3A through FIG. 3C are cross sections of an alternate microelectronic device depicted in successive stages of an example formation sequence. Referring to FIG. 3A, the microelectronic device 300 may be an integrated circuit, a discrete semiconductor component, a microelectronic mechanical system (MEMS) device, an optoelectronic device or a microelectronic fluidic device. The microelectronic device 300 includes a substrate 302, which may include one or more layers of semiconductor, dielectric material or metals. The substrate 302 may contain electrical components, optical components, micromechanical components, and/or fluid microchannels. Recesses 324 are formed in the substrate 302 extending from a top surface 320 of the substrate 302. The recesses 324 may not necessarily have equal widths 326, depths 328 or profiles 366. The widths 326 may range, for example, from 1 micron to 200 microns. The depths 328 may range, for example, from 0.5 microns to 10 microns. The profiles 366 may be, for example, vertical, sloped, or curved. The recesses 324 may be formed, for example, by etching into the substrate 302. Other methods of forming the recesses 324 are within the scope of the instant example.

A liner layer 332 is formed over the top surface 320 of the substrate 302, extending into the recesses 324. The liner layer 332 may be one or more layers of metal, semiconductor or dielectric material. The liner layer 332 may be formed, for example, by any combination of sputtering, evaporation, electroplating, ALD, reactive sputtering, MOCVD, or vapor phase transfer. In the instant example, the liner layer 332 does not fill the recesses 324.

A layer of protective material 338 is formed over the liner layer 332, covering the liner layer 332 in the recesses 324. The layer of protective material 338 may include one or more layers of material, such as photoresist, resin, or polymer, possibly mixed with a solvent to obtain a desired thickness. The layer of protective material 338 may be formed, for example, by spin coating, spray or vapor phase transfer. The layer of protective material 338 may be baked, cured or otherwise treated to remove solvent and obtain a desired CMP removal rate. In the instant example, the layer of protective material 338 is not patterned through a process using a photolithographic operation, advantageously reducing fabrication cost and complexity of the microelectronic device 300.

Referring to FIG. 3B, a CMP process 342 removes the layer of protective material 338 and the liner layer 332 from over the top surface 320 of the substrate 302 while leaving a portion of the layer of protective material 338 in the recesses 324. The protective material 338 in the recesses 324 advantageously protects the liner layer 332 from the slurry of the CMP process 342. The layer of protective material 338 may have a higher CMP removal rate than the liner layer 332, which may advantageously provide a higher process latitude for the CMP process 342. The CMP process 342 may be timed or endpointed.

Referring to FIG. 3C, the protective material 338 of FIG. 3B is removed from the recesses 324, leaving the liner layer 332 in the recesses 324. Additional layers may be formed over the liner layer 332 and the top surface 320 of the substrate 302 to continue formation of the microelectronic device 300.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a microelectronic device, comprising the steps:
   providing a substrate having a recess in a top surface of the substrate;
   forming a metal liner layer over the top surface of the substrate and extending into the recess;
   forming a layer of protective material over the metal liner layer, the layer of protective material extending into the recess and covering the metal liner layer in the recess;
   removing the layer of protective material and the metal liner layer from over the top surface of the substrate using a CMP process while leaving a remaining portion of the layer of protective material and the metal liner layer in the recess; and
   subsequently removing the remaining portion of layer of protective material from the recess, leaving the metal liner layer in the recess.

2. The method of claim 1, wherein the layer of protective material comprises photoresist.

3. The method of claim 1, wherein the layer of protective material comprises a resin.

4. The method of claim 1, wherein the layer of protective material comprises polymer.

5. The method of claim 1, wherein the layer of protective material comprises a material mixed with a solvent.

6. The method of claim 5, wherein the layer of protective material is treated to remove solvent.

7. The method of claim 1, wherein the layer of protective material is not photolithographically patterned between forming the layer of protective material and removing the remaining portion of the layer of protective material.

8. The method of claim 1, wherein the steps of removing the layer of protective material and the metal liner layer from over the top surface of the substrate using a CMP process and subsequently removing the remaining portion of layer of protective material completely remove the layer of protective material.

9. A method of forming a microelectronic device, comprising the steps:
   forming a first recess and a second recess in a top surface of a substrate, wherein the first recess has a different width than the second recess;
   forming a metal liner layer over the top surface of the substrate and extending into the first recess and the second recess;
   forming a layer of protective material over the metal liner layer, the layer of protective material extending into the first recess and the second recess;
   removing the layer of protective material and the metal liner layer from over the top surface of the substrate using a CMP process while leaving a remaining portion of the layer of protective material and the metal liner layer in the first recess and the second recess; and
   subsequently removing the remaining portion of layer of protective material from the first recess and the second recess, leaving the metal liner layer in the first recess and the second recess.

10. The method of claim 9, wherein the layer of protective material comprises a material selected from the group consisting of photoresist, resin, and polymer.

11. The method of claim 10, wherein the material of the layer of protective material is mixed with a solvent.

12. The method of claim 11, wherein the layer of protective material is treated to remove solvent.

13. The method of claim 9, wherein the layer of protective material is not photolithographically patterned between forming the layer of protective material and removing the remaining portion of the layer of protective material.

14. The method of claim 9, wherein the first recess has a different depth than the second recess.

15. The method of claim 9, wherein the steps of removing the layer of protective material and the metal liner layer from over the top surface of the substrate using a CMP process and subsequently removing the remaining portion of layer of protective material completely remove the layer of protective material.

16. A method of forming a microelectronic device, comprising the steps:
   forming a first recess and a second recess in a top surface of a substrate;
   forming a liner layer over the top surface of the substrate and extending into the first recess and the second recess;
   forming a layer of protective material over the liner layer, the layer of protective material extending into the first recess and the second recess;
   removing the layer of protective material and the liner layer from over the top surface of the substrate using a CMP process while leaving a portion of the layer of protective material and the liner layer in the first recess and the second recess; and
   subsequently completely removing the portion of the layer of protective material from the first recess and the second recess, leaving the liner layer in the first recess and the second recess.

17. The method of claim 16, wherein the first recess has a different depth than the second recess.

18. The method of claim 16, wherein the first recess has a different width than the second recess.

19. The method of claim 16, wherein the layer of protective material comprises a material selected from the group consisting of photoresist, resin, and polymer.

* * * * *